(12) United States Patent
Kohara et al.

(10) Patent No.: US 6,716,540 B2
(45) Date of Patent: Apr. 6, 2004

(54) MULTILAYER FILM FORMED BODY

(75) Inventors: Toshimitsu Kohara, Takasago (JP); Koichiro Akari, Takasago (JP); Eiji Iwamura, Kobe (JP)

(73) Assignee: Kabushiki Kaisha Kobe Seiko Sho, Kobe (JP)

( * ) Notice: Subject to any disclaimer, the term of this patent is extended or adjusted under 35 U.S.C. 154(b) by 30 days.

(21) Appl. No.: 10/087,736

(22) Filed: Mar. 5, 2002

(65) Prior Publication Data

US 2002/0136895 A1 Sep. 26, 2002

(30) Foreign Application Priority Data

Mar. 6, 2001 (JP) ......................................... 2001-062395

(51) Int. Cl.$^7$ .......................... B32B 15/04; B32B 15/08; B32B 15/20
(52) U.S. Cl. ...................... 428/634; 428/408; 428/610; 428/612; 428/650; 428/653; 428/654; 428/666; 428/681; 428/332
(58) Field of Search .................. 428/408, 409, 428/609, 610, 612, 627, 634, 650, 651, 652, 653, 654, 663, 666, 681, 683, 687, 217, 220, 332, 457, 698, 937

(56) References Cited

U.S. PATENT DOCUMENTS

| 5,198,285 | A | * | 3/1993 | Arai et al. ................... 428/216 |
| 5,302,422 | A | * | 4/1994 | Nowak et al. ............... 427/533 |
| 5,763,087 | A | * | 6/1998 | Falabella ..................... 428/408 |
| 2001/0024737 | A1 | * | 9/2001 | Utsumi et al. ............... 328/651 |
| 2001/0046835 | A1 | * | 11/2001 | Wielonski et al. .......... 451/533 |

* cited by examiner

Primary Examiner—Michael LaVilla
(74) Attorney, Agent, or Firm—Oblon, Spivak, McClelland, Maier & Neustadt, P.C.

(57) ABSTRACT

A multilayer film formed body comprises an outermost layer comprising a diamondlike carbon film, a substrate comprising an iron material, and an intermediate layer comprising a first layer on the substrate side, and a second layer on the outermost layer side. The first layer comprises at least either metal of Cr and Al, and a second layer comprises an amorphous layer including carbon and at least either metal of Cr and Al. The second layer has a gradient structure where the metal decreases as the position becomes closer to the outermost layer. The hardness of the second layer increases stepwise or continuously as the position becomes closer to the outermost layer. The hardness of the second layer close to the first layer is close to the hardness of the first layer. The hardness of the second layer close to the outermost layer is close to the hardness of the outermost layer.

19 Claims, 4 Drawing Sheets

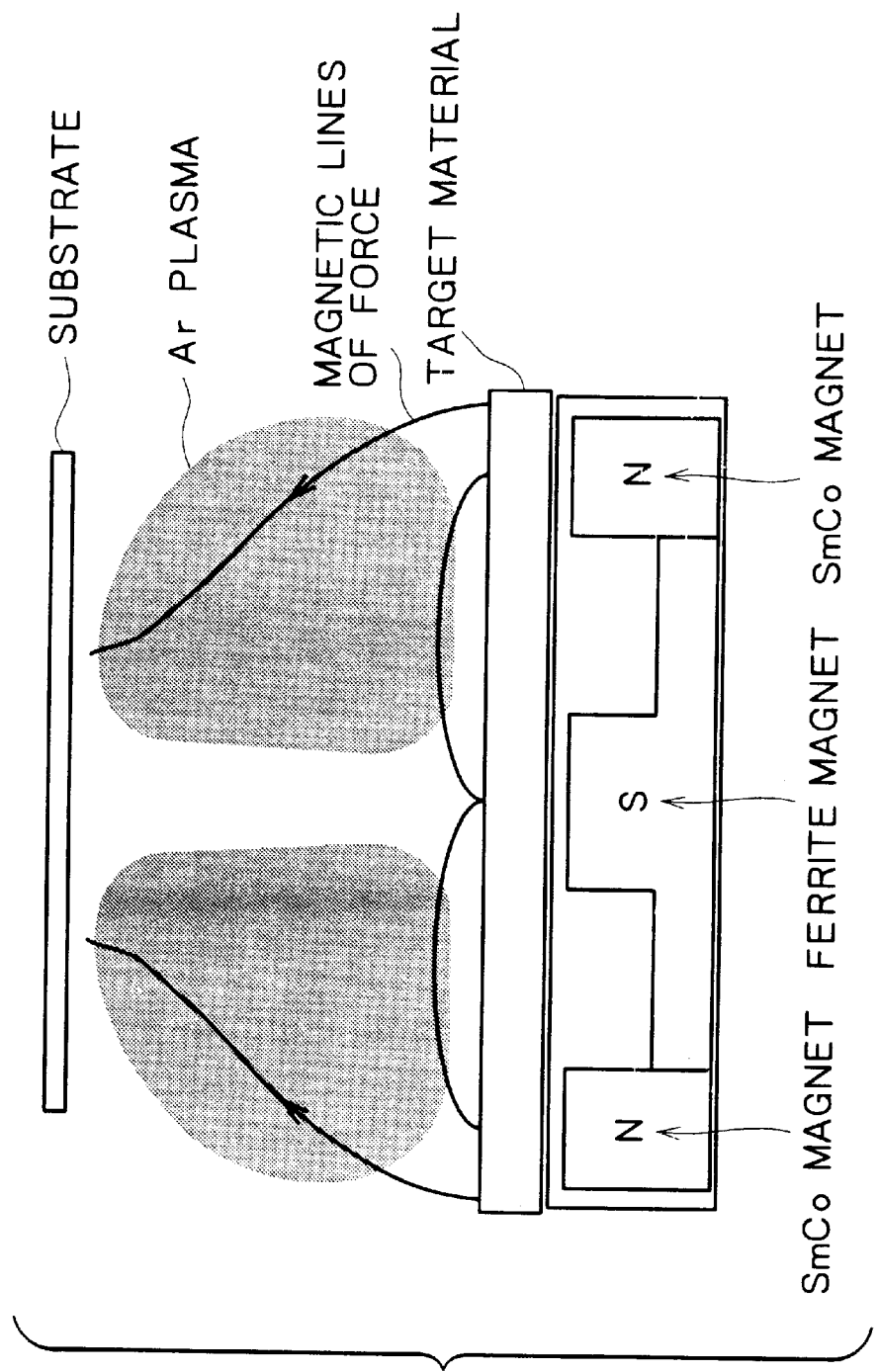

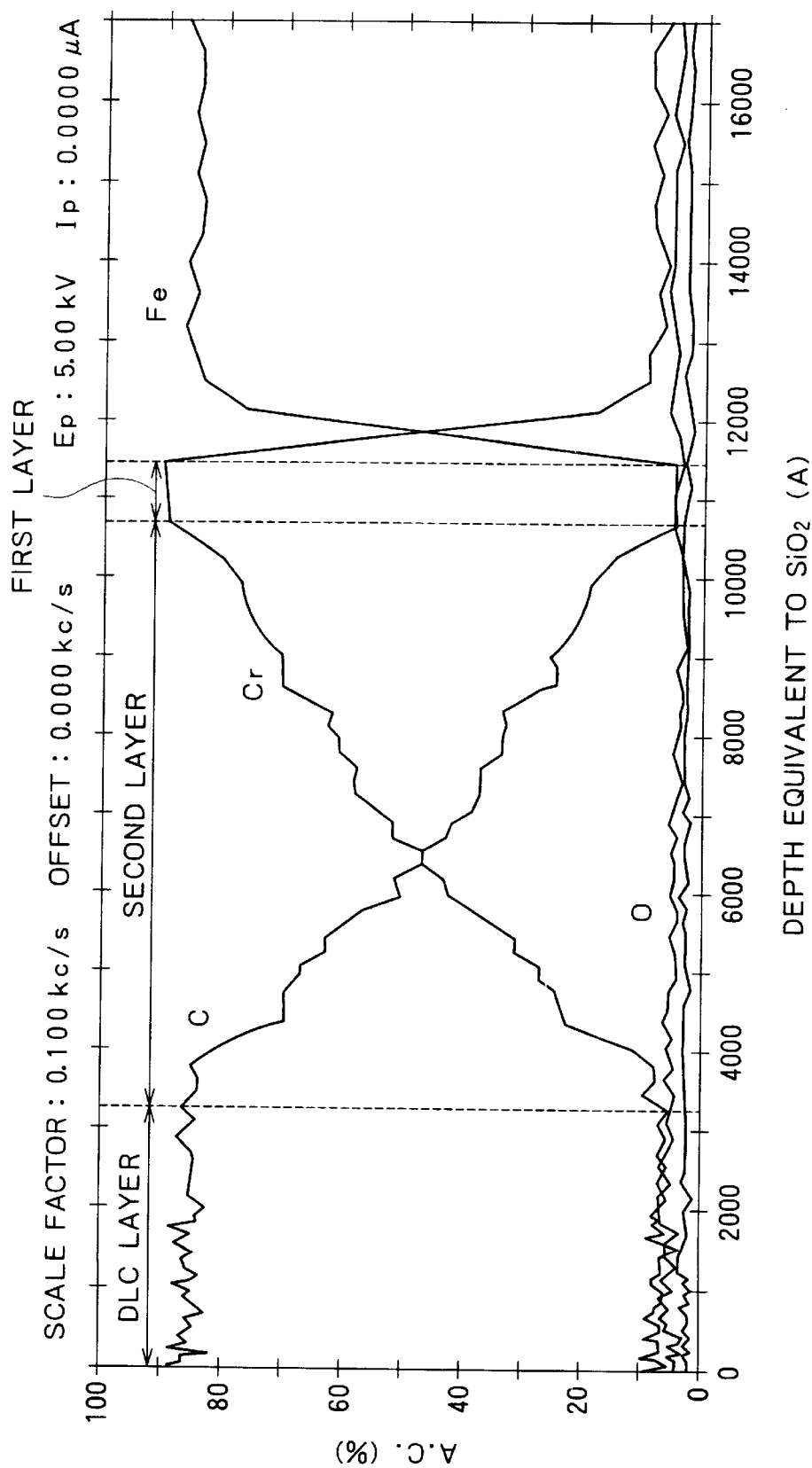

FIG. 4

| | FILM FORMING METHOD | STRUCTURE OF INDIVIDUAL LAYERS OF DLC MULTILAYER | | | | SUBSTRATE BIAS CONDITION FOR FORMING DLC FILM | ADHESION STRENGTH (N) | HRC TEST | REMARK |
|---|---|---|---|---|---|---|---|---|---|
| | | INTERMEDIATE FIRST LAYER | INTERMEDIATE SECOND LAYER | STRESS RELAXATION LAYER | DLC LAYER | | | | |
| REFERENCE 1 | UBM | NONE | NONE | NONE | 0.7 μm | 200V | 5 | DETACHMENT | DETACHMENT OVER TIME |
| REFERENCE 2 | UBM | NONE | NONE | NONE | 0.7 μm | 100V | 5 | DETACHMENT | DETACHMENT OVER TIME |
| EMBODIMENT 1 | UBM | Cr:0.1 μm | Cr/C:0.2 μm | NONE | 0.7 μm | 200V | 40 | CRACK | — |
| EMBODIMENT 2 | UBM | Cr:0.1 μm | Cr/C:0.2 μm | C:0.2 μm | 0.7 μm | 200V | 50 | NO DETACHMENT | — |
| EMBODIMENT 3 | UBM | Cr:0.1 μm SUBSTRATE TEMPERATURE 300°C FORMING DIFFUSION LAYER | Cr/C:0.2 μm | C:0.2 μm | 0.7 μm | 200V | 54 | NO DETACHMENT | — |
| EMBODIMENT 4 | UBM | Cr:0.1 μm DC300V FORMING MIXING LAYER | Cr/C:0.2 μm | C:0.2 μm | 0.7 μm | 100V | 56 | NO DETACHMENT | — |
| EMBODIMENT 5 | UBM | Cr:0.1 μm | Cr/C:0.2 μm INTERFACE HARDNESS ON DLC LAYER SIDE Hv1500 | NONE | 0.7 μm HARDNESS Hv2800 | 100V | 42 | NO DETACHMENT | — |
| EMBODIMENT 6 | UBM | Cr:0.1 μm | Cr/C:0.2 μm HARDNESS ON STRESS RELAXING LAYER SIDE Hv2700 | C:0.2 μm INTERFACE HARDNESS ON Cr/C INTERMEDIATE LAYER SIDE Hv1600 INTERFACE HARDNESS ON DLC LAYER SIDE Hv2700 | 0.7 μm | 100V | 60 | NO DETACHMENT | — |
| EMBODIMENT 7 | UBM | Cr:0.1 μm SUBSTRATE TEMPERATURE 300°C FORMING DIFFUSION LAYER | Cr/C:0.2 μm | C:0.2 μm | 0.7 μm | 100V | 58 | NO DETACHMENT | — |
| EMBODIMENT 8 | UBM | Cr:0.1 μm DC300V FORMING MIXING LAYER | Cr/C:0.2 μm | C:0.2 μm | 0.7 μm | 100V | 57 | NO DETACHMENT | — |
| EMBODIMENT 9 | UBM | Cr:0.2 μm | Cr/C:0.4 μm | C:0.5 μm | 0.7 μm | 100V | 50 | NO DETACHMENT | — |
| EMBODIMENT 10 | UBM | Al:0.1 μm | Al/C:0.2 μm | C:0.2 μm | 0.7 μm | 100V | 48 | NO DETACHMENT | — |
| EMBODIMENT 11 | UBM | Cr:0.1 μm | Cr/C:0.2 μm INTERFACE HARDNESS ON DLC LAYER SIDE Hv2700 | NONE | 0.7 μm HARDNESS Hv2800 | 100V | 55 | NO DETACHMENT | — |

MULTILAYER FILM FORMED BODY

BACKGROUND OF THE INVENTION

1. Field of the Invention

The present invention relates to a multilayer film formed body which has a diamondlike carbon film as a surface layer, and is suitable for a surface protection film for a member which especially requires wear resistance and surface smoothness such as a slide member for precision molds, cutting tools, wear resistant machine parts, abrasives, magnetic and optical parts, and printer heads.

2. Description of the Related Art

Hard carbon is a hard material generally called as diamondlike carbon. The diamondlike carbon may be abbreviated as "DLC".

The DLC has an intermediate structure of mixed diamond and graphite. The DLC has high hardness as diamond, and is excellent in wear resistance, solid lubrication, heat conductance, and chemical stability. Thus, it has come to be used as a protective film for different types of parts such as slide members, molds, cutting tools, wear resistant machine parts, abrasives, and magnetic and optical parts.

Physical vapor deposition (PVD) such as sputtering and ion plating, and chemical vapor deposition (CVD) are adopted as a method for forming a DLC film. The DLC film generally generates an extremely large internal stress when the film is formed, while it has high hardness and Young's modulus, because its deformability is extremely small, it has low adhesiveness to substrate, and has a defect of easily separating.

Thus, different technologies have been proposed for improving adhesiveness to substrate.

They are roughly divided into two categories including:

(1) Controlling film stress, and (2) Providing an intermediate layer between the substrate and the carbon film.

These technologies have the following problems, and it has been required to improve these problems.

The method in (1) does not essentially solve the problem of instability of the adhesiveness at the heterogeneous interface between the substrate and the carbon film.

The method in (2) essentially uses the film which has an intermediate characteristic between the substrate and the DLC in mechanical property to combine the substrate with the DLC film. A material including a hard brittle material is used for the intermediate layer. However, when CVD or PVD is used to form a thick film with thickness of several micrometers, or a hard film including a large amount of the diamond component whose hardness exceeds 40 Gpa is formed, defective adhesiveness becomes remarkable.

When an iron material is used as the substrate, and a multilayer film which has a DLC film as the outermost layer is formed on the substrate, because the internal stress of the DLC film, which is the outermost layer, is large, the adhesiveness between the intermediate layer and the DLC film is inferior. Especially when the thickness of the highly hard DLC film exceeds 3 $\mu$m, it is difficult to secure sufficient adhesiveness.

The iron material is widely used, and has usefulness such as inexpensiveness and excellent toughness compared with carbide. It has been expected to establish a technology for adhesively covering this useful iron material with the DLC film.

SUMMARY OF THE INVENTION

The object of the present invention is to use an iron material as a substrate, to form a DLC film as the outermost layer presenting excellent adhesiveness even when formed relatively thickly on the substrate, and to provide a hard multilayer film formed body.

The multilayer film formed body of the present invention comprises an outermost layer comprising a diamondlike carbon film, a substrate comprising an iron material, and an intermediate layer comprising a first layer on the substrate side comprising at least either metal of Cr and Al, and a second layer on the outermost layer side comprising an amorphous layer including carbon and at least either metal of Cr and Al.

It is preferable that the second layer has a gradient structure where the metal decreases as the position becomes close to the outermost layer, and the hardness of the second layer increases stepwise or continuously as the position becomes closer to the outermost layer.

It is preferable that the hardness of the second layer close to the first layer is close to the hardness of the first layer.

It is preferable that the hardness of the second layer close to the outermost layer is close to the hardness of the outermost layer.

It is preferable that a stress relaxation layer comprising carbon is formed between the second layer and the outermost layer. It is more preferable that the hardness of the stress relaxation layer increases stepwise or continuously as the position becomes closer to the outermost layer.

It is preferable that the hardness of the stress relaxation layer at an interface with the second layer is close to the hardness of the second layer. It is preferable that the hardness of the stress relaxation layer close to the outermost layer is close to the hardness of the outermost layer.

It is preferable that a diffusion layer is formed by diffusing the metal elements constituting the first layer on the surface of the substrate.

It is preferable that a mixing layer is formed between the substrate and the first layer, and has mixed elements from the metal elements constituting the first layer, and the elements constituting the substrate.

BRIEF DESCRIPTION OF THE DRAWINGS

FIG. 2 is a schematic descriptive drawing for showing a cathode structure in unbalanced magnetron sputtering;

FIG. 3 is a graph showing an example of AES depth direction analysis when a second layer is formed while the unbalanced magnetron sputtering is used to control a sputter power to adjust a composition ratio of metal (Cr) to carbon; and FIG. 4 is a table for showing an example of an evaluation result of multilayer film formed bodies relating to the present invention.

DETAILED DESCRIPTION OF THE PREFERRED EMBODIMENTS

Figure 1:
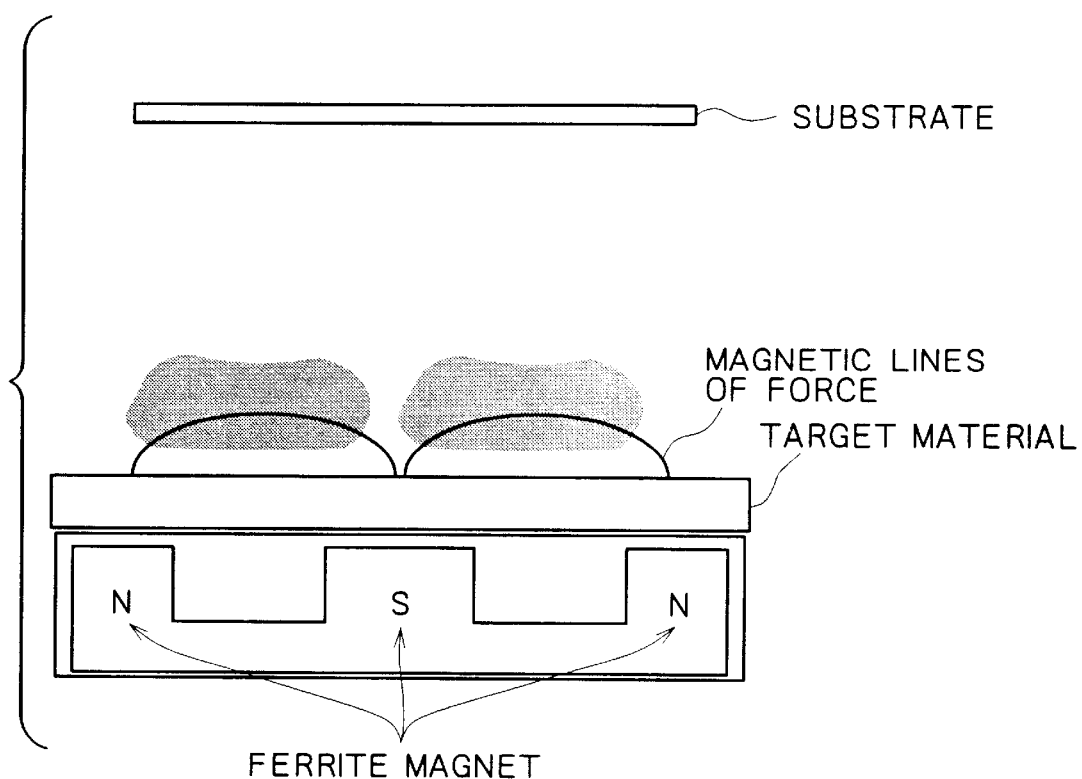
FIG. 1 is a schematic descriptive drawing for showing a cathode structure for conventional sputtering.

The inventors studied the structure of an intermediate layer for securing excellent adhesiveness between a substrate and a DLC film from different angles when an iron material is used as the substrate. As the result, the inventors found that the purpose above is successfully achieved if an intermediate layer has a two-layer structure comprising a first layer on the substrate said comprising at least either metal of Cr and Al, and a second layer on the outermost layer side comprising an amorphous layer including carbon and at least either metal of Cr and Al, and completed the present invention.

The adhesiveness between the substrate and the DLC film is guaranteed by the intermediate layer interposed between them in the multilayer film formed body of the present invention. The layer on the substrate side (the first layer) comprising at least either metal of Cr and Al presents excellent compatibility with the iron material as the substrate, and shows excellent adhesiveness to the iron material in the intermediate layer. Interposing the layer on the substrate side (the first layer) secures the adhesiveness between the substrate and the intermediate layer (the first layer).

The amorphous layer including carbon and at least either metal of Cr and Al is formed as a layer on the outermost layer side (the second layer) of the intermediate layer without forming a brittle carbide layer. Here, the amorphous layer means a layer on which a transmission electron microscope cannot observe a crystal phase. In this way, when the second layer does not include a minute precipitated layer inside, the intermediate layer itself does not include a brittle part, and internal detachment and breakage are prevented. A generation of a stress caused by a lattice misfit is mitigated against the first layer on the substrate side, and using the same type of the metal elements secures the adhesiveness. Because the DLC film which forms the outermost layer is an amorphous film, it presents excellent adhesiveness to an amorphous layer comprising a mixed layer of metal elements and carbon as described above.

It is not always necessary that the metal elements constituting the first layer and the metal elements included in the second layer are the same, and the same effect is presented if the metal elements included in one layer is different from the metal elements included in the other layer (the first layer is a Cr layer, and the second layer is a layer comprising Al and C, for example). However, it is preferable that metal elements included in the first layer and the second layer are the same (the first layer is a Cr layer, and the second layer is a layer comprising Cr and C, for example), or any one of elements included one layer is included in the other layer (the first layer is a layer comprising Cr and Al, and the second layer is a layer comprising Cr and C, for example).

It is preferable that the second layer has a gradient structure where the metal decreases stepwise or continuously from the first layer side (the substrate side) to the DLC film side (the outermost layer side) (namely, carbon density increases from 0% to 100%). Adopting this film structure changes a mechanical property of the multilayer film stepwise or continuously from the substrate side to the DLC side, and this prevents a thermal shock from generating a local stress concentration causing a detachment.

It is preferable that a difference $\Delta H$ between the Vickers hardness H2 of the outermost layer, and the Vickers hardness H1 of the interface of the second layer with the outermost layer, namely |H2−H1|, is adjusted to equal to or less than 1000. As a result, it is possible to decrease the difference in hardness at the interface between the second layer and the other layer, and an effect of more hardly presenting a detachment is provided. Either one of H1 and H2 may be large than the other in the relationship between the Vickers hardness H1 and H2. Namely, the hardness difference $\Delta H$ between the neighboring layers is simply 1000 or less (this also applies to the relationship between a stress relaxation layer described later and the other layer).

It is effective to form the stress relaxation layer comprising carbon between the second layer and the outermost layer. It is preferable that the stress relaxation layer has hardness close to the second layer at the interface with the second layer, and the hardness increases stepwise or continuously as the position becomes close to the outermost layer, and the stress relaxation layer has hardness close to the diamondlike carbon film in the neighborhood of the outermost layer. It is preferable that the difference $\Delta H$ between Vickers hardness H5 of the stress relaxation layer at the interface with the outermost layer, and the Vickers hardness H2 of the outermost layer, namely |H2−H5|, is adjusted to equal to or less than 1000.

When the stress relaxation layer is formed in this way, it is preferable that the difference $\Delta H$ between the Vickers hardness H3 of the second layer at the interface with the first layer, and the Vickers hardness H4 of the stress relaxation layer at the interface with the second layer, namely H4−H3, is adjusted to equal to or less than 1000. It is preferable that a ratio d1:d2 of the thickness d1 of the stress relaxation layer to the thickness d2 of the outermost layer is 1:4 to 4:1.

When the hardness of the stress relaxation layer is set as described above, it is possible to reduce the difference between the hardness of the stress relaxation layer and the neighboring other layers as much as possible, to reduce a stress concentrated on the interfaces between the layers, and to increase the adhesiveness property. The carbon constituting the stress relaxation layer is in an amorphous state (same as the DLC film excepting the hardness), and interposing the carbon in this form between the outermost layer and the second layer effectively presents a function as the stress relaxation layer.

It is preferable that (a) a diffusion layer is formed by diffusing the metal elements constituting the first layer on the surface of the substrate, or (b) a mixing layer is formed between the substrate and the first layer, and having mixed elements from the metal elements constituting the first layer, and the elements constituting the substrate in terms of increasing the adhesiveness with the substrate when any one of the constitutions is adopted for the multilayer film formed body of the present invention. It is preferable that the thickness of the intermediate layer (the sum of the thickness of the first layer and the second layer) is 5 to 50% of the thickness of the entire multilayer film formed body. This constitution provides high adhesiveness without damaging film quality on the surface of the DLC film.

It is preferable that the intermediate layer and the DLC film are formed using unbalanced magnetron sputtering in the present invention.

The following section describes the principle of the unbalanced magnetron sputtering while using drawings. FIG. 1 shows a cathode structure of a conventional sputtering. Magnets having the same magnetic property are provided at the center and the periphery of a circular target. Ferrite magnets (Sm rare earth magnet or Nd rare earth magnet) are used for these magnets, for example. Closed loops of the magnet lines of force are formed in a neighborhood of a target material, and impressing a bias voltage on the substrate forms a material constituting the target material on the substrate.

On the other hand, magnets having different magnetic properties are provided at the center and the periphery of the circular target in a cathode structure for the unbalanced magnetron sputtering as shown in FIG. 2. A part of magnet lines of force generated from the stronger magnet reach as far as the neighborhood of the substrate while forming plasma.

Thus, the unbalanced magnetron sputtering provides an effect of diffusing plasma (such as Ar plasma) generated from sputtering as far as the neighborhood of the substrate along the magnet lines of force. Namely, it is possible to use ion assist effect where more Ar ions and electrons than those in the conventional sputtering reach the substrate along the magnet lines of force reaching as far as the substrate, and to form a consolidated and hard DLC film. Also, the unbalanced magnetron sputtering forms an intermediate layer comprising uniform amorphous layer without forming carbide even for Cr and Al which have high carbide forming property. When the composition ratio of the metal to the carbon in the second layer (namely, the hardness distribution in the second layer) is adjusted to manufacture the multilayer film formed body of the present invention, it is preferable that the second layer is formed using sputtering (preferably unbalanced magnetron sputtering), and the sputter power is controlled.

FIG. 3 is a chart for showing an example of an analysis in the depth direction of AES (Auger electron spectroscopy) for the multilayer film formed body when the second layer is formed when unbalanced magnetron sputtering is used to control the sputter power for adjusting the composition ratio of the metal (Cr) to carbon. The substrate used in this example is high speed steel (HSS), a Cr metal layer (the first layer) is formed on the surface of the substrate, the second layer is formed on it, and then the DLC film is formed. Though it seems that a small amount of oxygen is contained in FIG. 3, the analysis is conducted while sputtering is grinding the film in a vacuum container in AES analysis, and oxidization occurs in the analysis, which is considered to cause the analysis error.

This result shows the DLC film is formed on the outermost layer, and simultaneously, the second layer has a composition which continues to the composition of the outermost layer, namely the DLC film, on its outermost side, and becomes close to the composition of the first layer as the position comes close to the first layer. In this way, the composition ratio of the metal to carbon (the hardness distribution) is adjusted in the second layer.

When a multilayer film formed body in which a stress relaxation layer is formed is manufactured, controlling a bias voltage of DC or pulses impressed on the substrate changes the hardness of the stress relaxation layer continuously or stepwise.

When a multilayer film formed body in which a stress relaxation layer is formed between the substrate and the first layer is manufactured, the temperature of the substrate is controlled to 150 to 350° C., preferably 250 to 350° C., and the diffusion of the metal constituting the first layer into the substrate is promoted when the first layer is formed on the substrate. When a multilayer film formed body in which a mixing layer is formed between the substrate and the first layer is manufactured, a high bias voltage of DC or pulses of 100 to 1000 V is impressed on the substrate on an early stage of forming the first layer on the substrate, and a mixing layer is formed between the substrate and the first layer. When the mixing layer is formed, a method for generating metal ions such as plasma CVD or arc plasma vapor deposition is adopted, metal ions are implanted into the substrate in a wedge shape, and the surface of the substrate is activated. Even if a method such as sputtering, which ionizes almost no metal, is adopted, ions of introduced noble gas implant the metal into the substrate, the surface of the substrate is activated, and the adhesiveness of the substrate to the first layer increases.

In the present invention, the type of the iron material used as the substrate is not specifically limited. Forged steel and cast steel in addition to high speed steel, stainless steel, alloy tool steel, and carbon steel are used as the substrate in the present invention. With the present invention, it is possible to form the DLC film on the surface of the substrate with excellent adhesiveness.

The present inventors manufactured the multilayer film formed body relating the present invention in the following procedure.

HSS of 12 cm square and 5 mm thick with a mirror finish (Ra=0.02 $\mu$m) is used as the substrate, the HSS is dried after the HSS is cleaned with ultrasonic in an alkaline tank and a deionized tank. The substrate is mounted in a UBM sputter device (UBMS504 manufactured by Kobe Steel Ltd.) after the process above, the device is evacuated to $2 \times 10^{-5}$ Torr ($2.6 \times 10^{-3}$ Pa), the substrate is baked by a heater, and Ar plasma is used to etch the surface of the substrate. Unbalanced magnetron sputtering using Ar plasma forms a film, and DC bias voltage is impressed on the substrate.

A heater is used for heating in the previous step, the temperature of the substrate is controlled to 300° C., and the diffusion layer is formed between the first layer and the substrate only for embodiments 3 and 7 in a first layer forming step. The temperature of the substrate is controlled to 200° C. for other embodiments (embodiments 1, 2, 4 to 6, and 8 to 11). The DC bias voltage is controlled to 300V only on an early stage for forming the mixing layer between the first layer and the substrate only for the embodiments 4 and 8.

The sputter power is adjusted for the target of the metal and the carbon, and the composition ratio of the metal to the carbon is decreased as a gradient (10 steps in this case) for forming the second layer. The substrate bias for forming the second layer is constant excepting the embodiment 1, and the bias voltage increases stepwise for increasing the hardness of the interface with the DLC layer during forming the second layer only for embodiment 11. Only the carbon target is sputtered with a constant power for forming the stress relaxation layer, and the DC bias is controlled to adjust the hardness in the layer. Both the sputter power (4 kW) and the substrate bias voltage are set to constant for forming the DLC film (the outermost layer).

A scratch test and a Rockwell indentation test (HRC test) are used for evaluating adhesiveness (adhesion strength and existence of detachment) of the obtained different types of multilayer film formed bodies. A specimen is fixed on a movable stage, the stage is moved at 10 mm/min while a diamond indenter is used to apply a load at a load speed of 100 N/min on the surface of the specimen, a scratch is observed using a microscope, and a load which causes a detachment of the film is measured in the scratch test. A Rockwell hardness tester is used to indent a diamond indenter into the specimen at a load of 150 kg in the HRC test, and a detachment state around the indentation is observed. A film of 3 $\mu$m is formed on a specimen under the condition same as the interface film forming of the individual layers, and a microvickers (10 g) is used to measure the hardness.

FIG. 4 shows the evaluation result as a whole. FIG. 4 also shows formed bodies where the DLC film is directly formed on the surface of the substrate without forming the intermediate film (references 1 and 2).

The following observation is obtained from the result. The adhesiveness of the DLC film to the substrate is low, and the DLC film is detached at an early stage of the HRC test in the references 1 and 2 where the DLC film is directly formed on the substrate. It is also observed that the film is detached from the substrate over time.

On the other hand, the embodiments of the present invention stably present adhesiveness of 40 N or more in the scratch test. The embodiments where the stress relaxing layer (the embodiments 2 to 4 and 6 to 10), the diffusion layer (the embodiments 3 and 7), or the mixing layer (the embodiments 4 and 8) is formed present the adhesion strength of 50 N or more in the scratch test.

As FIG. 4 clearly shows, it is observed that the high adhesiveness is realized while the DLC film has high hardness. The embodiment 9 shows that a high adhesiveness is maintained when the overall film thickness of the multilayer film formed body is increased to about 3 μm. When the embodiments 11, 5, and 6 are compared with one another, decreasing the difference in hardness between the individual layers prevents the internal stress from concentrating on the interfaces, and increases the adhesiveness.

Al is used as the metal element constituting the intermediate layer (the first layer and the second layer) in the embodiment 10, and high adhesiveness is provided as in the case where Cr is used.

We claim:

1. A multilayer film formed body comprising:
    an outermost layer comprising a diamondlike carbon film;
    a substrate comprising an iron material; and
    an intermediate layer comprising a first layer on the substrate side comprising at least one of a metal selected from the group consisting of Cr and Al and a second layer on the outermost layer side comprising an amorphous layer including carbon and at least one of a metal selected from the group consisting of Cr and Al.

2. The multilayer film formed body according to claim 1, wherein said second layer has a gradient structure where the content of said metal decreases as a position becomes close to the outermost layer, and the hardness of said second layer increases stepwise or continuously as a position becomes closer to the outermost layer.

3. The multilayer film formed body according to claim 2, wherein the hardness of said second layer at the interface with said first layer is close to the hardness of said first layer.

4. The multilayer film formed body according to claim 2, wherein the hardness of said second layer at the interface with said outermost layer is close to the hardness of said outermost layer.

5. The multilayer film formed body according to claim 2, wherein a difference ΔH between the Vickers hardness H2 of the outermost layer, and the Vickers hardness H1 of the second layer at the interface with said outermost layer is equal to or less than 1000.

6. The multilayer film formed body according to claim 1 further comprising a stress relaxation layer formed between said second layer and said outermost layer, and comprising carbon, wherein the hardness of the stress relaxation layer increases stepwise or continuously as a position becomes closer to the outermost layer.

7. The multilayer film formed body according to claim 6, wherein the hardness of said stress relaxation layer at an interface with the second layer is close to the hardness of said second layer at the interface with said stress relaxation layer.

8. The multilayer film formed body according to claim 6, wherein the hardness of said stress relaxation layer at the interface with said outermost layer is close to the hardness of said outermost layer at the interface with said stress relaxation layer.

9. The multilayer film formed body according to claim 6, wherein a difference ΔH between the Vickers hardness H4 of said stress relaxation layer at an interface with the second layer, and the Vickers hardness H3 of said second layer at an interface with the stress relaxation layer is equal to or less than 1000.

10. The multilayer film formed body according to claim 6, wherein a difference ΔH between the Vickers hardness H2 of said outermost layer, and the Vickers hardness H5 of said stress relaxation layer at an interface with the outermost layer is equal to or less than 1000.

11. The multilayer film formed body according to claim 6, wherein a ratio d1: d2 of the thickness d1 of said stress relaxation layer to the thickness d2 of the outermost layer is 1:4 to 4:1.

12. The multilayer film formed body according to claim 1 further comprising a diffusion layer formed by diffusing the metal elements constituting said first layer on the surface of said substrate.

13. The multilayer film formed body according to claim 1 further comprising a mixing layer formed between said substrate and said first layer, and having mixed elements from the metal elements constituting said first layer, and the elements constituting said substrate.

14. The multilayer film formed body according to claim 1, wherein the thickness of said intermediate layer is 5 to 50% of the thickness of the entire multilayer film formed body.

15. The multilayer film formed body according to claim 1, wherein said diamondlike carbon film is formed using unbalanced magnetron sputtering.

16. The multilayer film formed body according to claim 2, wherein said second layer is formed using sputtering, and a composition ratio of the gradient structure of said metal elements to carbon is adjusted based on a sputtering power in the second layer.

17. The multilayer film formed body according to claim 6, wherein said stress relaxation layer is formed using sputtering, and the stepwise or continuous hardness of the stress relaxation layer is adjusted based on a bias voltage of DC or pulses impressed on said substrate.

18. The multilayer film formed body according to claim 12, wherein said diffusion layer is formed by controlling the temperature of the substrate to 150 to 350° C. at a stage of forming said first layer on said substrate.

19. The multilayer film formed body according to claim 13, wherein said mixing layer is formed by impressing a bias voltage of DC or pulses of 100 to 1000 V at an early stage of forming said first layer on said substrate.

* * * * *

UNITED STATES PATENT AND TRADEMARK OFFICE
CERTIFICATE OF CORRECTION

PATENT NO. : 6,716,540 B2
DATED : April 6, 2004
INVENTOR(S) : Kohara et al.

It is certified that error appears in the above-identified patent and that said Letters Patent is hereby corrected as shown below:

<u>Title page,</u>
Item [73], Assignee, should read:

-- [73] Assignee: Kabushiki Kaisha Kobe Seiko Sho (Kobe Steel, Ltd.), Kobe (JP) --

Signed and Sealed this

Eighth Day of June, 2004

JON W. DUDAS
*Acting Director of the United States Patent and Trademark Office*